United States Patent [19]

Miner

[11] 3,871,237

[45] Mar. 18, 1975

[54] TUNER DRIVE ASSEMBLY WITH INERTIAL FINE TUNE STABILIZER

[75] Inventor: Carroll R. Miner, Wilbraham, Mass.

[73] Assignee: General Instrument Corporation, Newark, N.J.

[22] Filed: Mar. 4, 1974

[21] Appl. No.: 447,975

[52] U.S. Cl. ............... 74/10.54, 74/10 R, 74/10.41, 74/10.8, 74/572

[51] Int. Cl. ............................................ F16h 35/18

[58] Field of Search ............... 74/10.54, 10.52, 10.8, 74/10 R, 10.41, 572, 573

[56] References Cited

UNITED STATES PATENTS

| | | | |
|---|---|---|---|
| 3,618,405 | 11/1971 | Isida | 74/10.6 |
| 3,618,406 | 11/1971 | Mohri et al. | 74/10.54 |
| 3,780,594 | 12/1973 | Tonari | 74/10.52 |
| 3,797,322 | 3/1974 | Miner | 74/10.8 |

*Primary Examiner*—Samuel Scott
*Assistant Examiner*—Randall Heald

[57] ABSTRACT

The assembly has a detented rotatable selector shaft and a rotatable fine tuning shaft which is adapted to move with the selector shaft to preserve the fine tune setting as the channels are changed. Drive means connected to both shafts and the input member of the tuning element is adapted to drive the input member in accordance with the movements of each of the shafts respectively. Normally, the movement of the fine tune shaft and associated components, caused by movement of the selector shaft, has an adverse inertial effect on the drive means because of the intermittent rotation of the selector shaft due to the detenting thereof. This effect manifests itself by causing the fine tuning shaft and associated components to rotate through a greater angle than the selector shaft thereby disturbing the fine tuning setting. The present invention provides inertia means operably connected to the drive means and the fine tune shaft which is movable relative to the fine tune shaft during the movement thereof. The inertia means has an inertial effect on the drive means during movement of the selector shaft which is substantially equal to but in an opposite sense from the inertial effect of the fine tune shaft and associated components. Thus, the inertia means serves to counterbalance the inertial effect of the fine tuning shaft thereby stabilizing the fine tuning setting.

8 Claims, 1 Drawing Figure

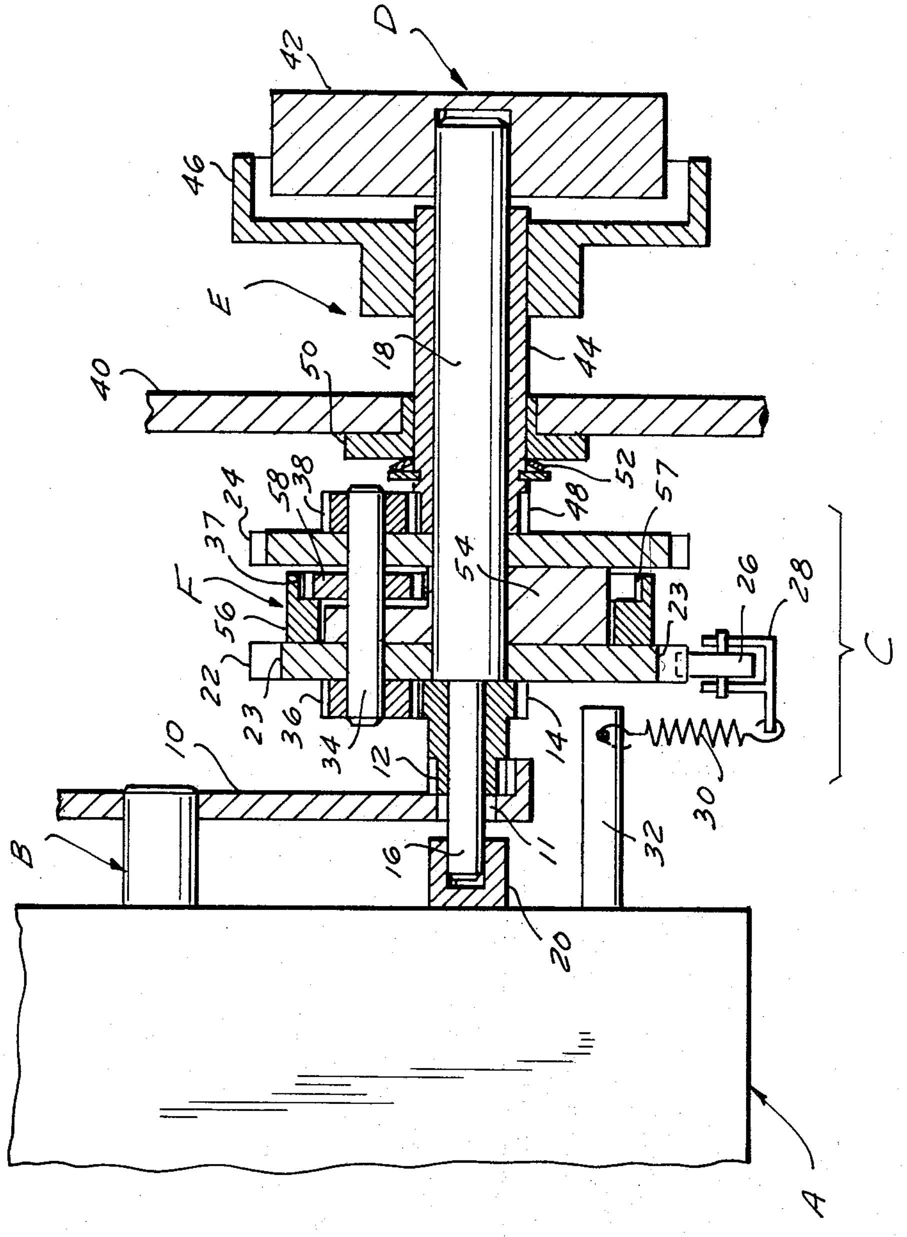
D
42
46
E
40
50
18
44
52
48
57
24
58
38
37
54
F
56
22
23
26
28
C
36
34
12
14
10
30
32
11
16
B
20
A

TUNER DRIVE ASSEMBLY WITH INERTIAL FINE TUNE STABILIZER

The present invention relates to tuner drive assemblies and more particularly to a tuner drive assembly having an inertial fine tune stabilizer to maintain the fine tuning setting during channel selection.

A tuner drive assembly is that portion of a television receiver or the like which mechanically translates the manipulation of the control knobs into the appropriate input such that the tuning element may be corporeally conditioned to select the desired frequency. A tuner drive assembly is normally provided with a pair of rotatable shafts which extend to the exterior of the receiver enclosure for accessibility. One of these shafts is utilized to coarse tune the tuning element for channel selection and the other to provide fine tuning. Each of the shafts is connected to a drive means which in turn is connected to the input member of the tuning element.

Tuner drive assemblies with drive means in various forms are well known in the art. Basically, the function of the drive means portion of the assembly is to combine the rotation of each of the shafts into a single rotation which is imparted to the input member of the tuning element to condition the tuning element. The mechanical arrangement of the drive means must be such that the rotation of the fine tuning shaft does not affect the position of the channel selector shaft. Further, in order to eliminate the necessity for fine tuning between each channel change, the mechanism should be designed to preserve the fine tune setting as the selector shaft is rotated.

Normally, the selector shaft is detented to facilitate the correct positioning of the selector shaft during channel selection. The mechanical connection between the selector shaft and the fine tuning shaft within the drive means must be such that the fine tune mechanism moves with the selector shaft in order to preserve fine tuning during channel selection but is independently movable relative to the selector shaft to effect fine tuning after a channel has been selected. In a typical mechanism, this interconnection is provided by the inclusion of a slip clutch, brake, viscous fluid, or the like for providing resistive loss or friction during the movement of the fine tuning shaft. These mechanisms provide only limited control of fine tune stability since the amount of resistive loading that can be used is limited to that which the detent system torque can accept. Exceeding this amount would cause the switching of channels when an attempt was made to fine tune a selected channel. Furthermore, the dependence entirely upon resistive loading never completely eliminates movement of the fine tuning system since there must be relative motion for the resistive loss to occur, which loss can only serve to reduce the movement. Thus, if the resistive loading is too great, channel selection is disrupted. However, by overly lowering the resistive load, the fine tuning shaft tends to overshoot the angular rotation of the selector shaft and the fine tuning setting becomes less stable during channel selection.

Since the fine tuning portion of the mechanism moves with the selector shaft during channel selection, a certain amount of kinetic energy is imparted to the fine tune mechanism as the selector shaft is rotated. The selector shaft is detented into position, and thus it tends to rotate intermittently and to terminate its rotation abruptly. However, since the fine tune mechanism is only resistively loaded, the motion thereof will be relatively constant but the mass thereof will cause the fine tuning mechanism to overshoot the appropriate stop position. The kinetic energy imparted to the fine tune mechanism has an inertial effect on the mechanism which causes the fine tune mechanism to continue to move for a brief period after the movement of the selector shaft has abruptly terminated.

Inertia can be thought of as that force which acts on a mass to keep the mass at rest when it is at rest and to keep the mass in motion when it is in motion. Thus, at the beginning of the movement of a mass, a certain portion of kinetic energy is stored therein as a force applied to initiate motion. This stored energy will cause the mass to continue to move even after the moving force has terminated. In fact, the mass will move indefinitely until the energy is dissipated in some manner such as by friction or gravity.

In the tuner drive assembly, the rest inertia of the selector shaft and fine tuning mechanism is overcome by applying a rotational force to the selector shaft during the initial portion of the rotation. The moment of inertia of the selector shaft is overcome by the detenting of this portion of the mechanism such that the motion of the selector shaft terminates at the proper position. The resistive connection between the fine tune portion of the mechanism and the remainder of the mechanism serves to dampen the moment of inertia of the fine tuning mechanism by converting the stored kinetic energy into heat by means of friction. Therefore it can be seen that the higher the frictional force on the fine tuning mechanism, the more quickly the kinetic energy will be dissipated and the less motion of the fine tuning mechanism will occur after the selector shaft motion has terminated. However, as noted above, there is a practical limit to how much friction can be applied to the fine tuning mechanism because the fine tuning must be independently rotatable such that fine tuning does not adversely affect channel selection.

It is, therefore, a prime object of the present invention to provide a tuner drive assembly which incorporates means to counteract the inertial forces which cause fine tuning instability and utilizes only a limited amount of friction loading to damp out residual amounts of disturbing forces.

It is another object of the present invention to provide a tuner drive assembly having inertia means adapted to neutralize the adverse effect of the moment of inertia of the fine tuning mechanism during channel selection.

It is a further object of the present invention to provide a tuner drive assembly with a flywheel and associated gearing movably connected to the fine tune mechanism and having a moment of inertia equal but in an opposite sense thereto such that the moment of inertia of the fine tuning mechanism is neutralized during channel selection.

In accordance with the present invention a tuner drive assembly is provided for use with a tuning element conditionable to select a particular frequency by the movement of an input member. The assembly includes movable coarse tuning means in the form of a rotatable selector shaft and movable fine tuning means in the form of a rotatable fine tuner shaft which is adapted to move with the selector shaft as the selector shaft is moved. Drive means are operably associated with each of the shafts and the input member, and are adapted to drive the input member in accordance with the movements of each of the shafts respective. The fine tuning means which includes the fine tuning shaft and associated hardware such as the fine tuned knob, has a given inertial effect on the drive means during the movement of the selector shaft. Inertia means are operably connected to the drive means and to the fine tuning means and movable relative to the fine tuning means during movement thereof. The inertia means has an inertial effect on the drive means during movement of the selector shaft which is substantially equal to but in an opposite sense from the inertial effect of the fine tuning means. Thus, the inertia means is effective to neutralize the moment of inertia of the fine tuning means during channel selection and thereby stabilize fine tuning.

Preferably, the inertia means comprises a movable mass in the form of a flywheel and motion transfer means in the form of a gear which is operably connected between the fine tuning means and the flywheel and is effective to move the flywheel in a sense opposite to the movement of the fine tuning means. The combined inertial effect of the flywheel and gear is approximately equal to the moment of inertia of the fine tuning means but acts in the opposite sense therefrom. Thus, during channel selection, both the flywheel and the fine tuning means are rotated but in opposite senses such that when the movement of the selector shaft terminates, and especially if it terminates abruptly, the moments of inertia from the flywheel and the fine tuning means cancel each other out, thereby maintaining fine tuning setting at the desired position.

To the accomplishment of the above and to such other objects as may hereinafter appear, the present invention relates to a tuner drive assembly having an inertial fine tune stabilizer as defined in the appended claims and as described in the specification, taken together with the accompanying drawing which shows a side cross-sectional view of a preferred embodiment of the present invention.

The tuner drive assembly of the present invention is designed for use with a tuning element which is corporeally conditionable to select a desired reception frequency. Tuning elements of this nature are well known in the art and take many forms. Since the particular tuning element utilized in conjunction with the assembly of the present invention forms no portion of the present invention, it is not illustrated in detail and shown only as situated within a metallic enclosure, generally designated A, in a fashion common in the industry. The tuning element is provided with an input member, generally designated B, which is movable to condition the tuning element. Input member B is operably connected to the drive means, generally designated C. Drive means C is manipulated by a coarse tuning means, generally designated D, and a fine tuning means, generally designated E, both of which are operably connected thereto. Coarse tuning means D and fine tuning means E are both independently movable but constructed such that fine tuning means E moves along with coarse tuning means D during movement thereof.

Operably connected to drive means C is inertia means F which comprises a movable mass means and a motion transferral means, the latter being operably connected to fine tune means E and effective to move the mass means in a sense opposite to the movement of the fine tuning means E. The mass of inertia means F is such that the moment of inertia thereof is substantially equal to the moment of inertia of fine tuning means E. Hence the inertial effect of means E and F will neutralize each other during channel selection. It follows that the movement of fine tuning means E during channel selection will not adversely affect the fine tuning setting and the fine tuning will be stabilized.

More specifically, input member B takes the form of a rotatable shaft which extends from enclosure A in which the tuning element is situated. Mounted to input member B is a gear 10. Gear 10 meshes with a pinion gear 12 such that the rotation of pinion gear 12 rotates member B. Gear 12 is driven by a gear 14 which, along with the gear 12, are rotatably mounted on a shaft 16 which is an extension of channel selector shaft 18. Gear 10 is provided with an arcuate slot 11 which permits shaft 16 to pass through gear 10. Slot 11 is shaped such that gear 10 can rotate throughout its permissible angle of rotation without interference from shaft 16. Shaft 16 extends from selector shaft 18, through slot 11 and is rotationally mounted on enclosure A by means of a collar 20 affixed to the surface of enclosure A.

Two spaced laterally extending supports 22 and 24 are mounted on selector shaft 18 for rotation therewith. Supports 22 and 24 are preferably in the form of discs and the edge of disc 22 is provided with a plurality of recesses 23 which interact with a spring loaded roller 26 in the well known detent fashion. Roller 26 is rotationally mounted on a movable support 28 which is connected to one end of a spring 30. The other end of spring 30 is connected to a member 32 which is fixedly mounted on enclosure A.

A shaft 34 is rotationally mounted on discs 22 and 24 such that it revolves around selector shaft 18 as selector shaft 18 is rotated. Shaft 34 extends beyond each of the discs 22 and 24 and a gear 36 is provided on one of the extended ends thereof. A gear 38 is provided on the other extended end such that the rotation of gear 38 will rotate shaft 34 and gear 36. Gear 36 meshes with gear 14 which in turn drives gear 12 such that the rotation of gear 36 will serve to rotate input member B. Thus, as shaft 34 revolves when selector shaft 18 is rotated, gear 36 will rotate gear 14 and input member B to corporeally condition the tuning element to select the desired channel. In order to facilitate manipulation of selector shaft 18, the end thereof is constructed to extend beyond the front of the receiver enclosure 40 and adapted to receive a knob 42.

Fine tuning means E comprises a shaft 44 which is coaxial with selector shaft 18 and also extends beyond enclosure 40. A fine tune knob 46, which is coaxial with selector knob 42, is operably connected to shaft 44 to facilitate rotation thereof. Fine tune shaft 44 is provided with a gear 48 which meshes with gear 38 mounted on shaft 34. Thus, the rotation of knob 46 rotates shaft 44, gear 38, and shaft 34, thus causing the rotation of gears 36, 14, 12, and 10 to rotate input member B to provide the fine tuning function.

A bushing 50 is mounted on receiver enclosure 40 at the point where shaft 44 extends therethrough. A cupped washer 52 is mounted on shaft 44 to provide limited friction loading of shaft 44. In addition, disc 24 may be provided with gear teeth along the periphery thereof which may be used to drive a readout mechanism such as a tape deck or other means for channel number display, in a conventional fashion.

Fixedly mounted to selector shaft 18 between discs 22 and 24 is a support 54. Support 54 serves as a mounting for inertia means F which preferably comprises a movable mass means in the form of a rotatable flywheel 56. Flywheel 56 is provided with internal gear teeth 57 designed to mesh with a motion transferral gear 58 which is mounted on shaft 34 to be driven thereby. Support 54 is provided with a recessed portion to provide a seat for gear 58. Since shaft 34 is connected to fine tune shaft 44 by means of gears 38 and 48, the rotation of shaft 44 will rotate gear 58 and thus flywheel 56. However, the rotation of flywheel 56 will be in a direction which is opposite to the rotation of fine tuning shaft 44. Inertial means F which includes flywheel 56 and gear 58 is designed to have substantially the same moment of inertia as fine tuning means E which comprises knob 46, shaft 44, gear 38, shaft 34, gears 36, 14, 12 and 10, and the input member B. Thus, since inertia means F is connected to fine tuning shaft 44 to rotate in a direction opposite to the rotation of shaft 44, inertia means F and fine tuning means E will rotate simultaneously and therefore neutralize each other's inertial effect on drive means C. In other words, the sum of the moments of inertia developed by inertia means F and fine tuning means E is zero, and therefore the remainder of the mechanism is not affected by the aggregate inertial effect thereof.

In operation, channel selection is performed by rotating knob 42 and thus shaft 18. The rotation of selector shaft 18 causes fine tuning shaft 44 and knob 46 to rotate therewith because of the interconnection between the shafts in drive means C. The rotation of shaft 18 drives disc 22 and thus shaft 34 revolves around shaft 18. The revolution of shaft 44 causes gear 36 to rotate gears 14, 12, and 10 thus driving input member B. Shaft 18 is detented into the appropriate position by means of detent roller 26 which communicates with the periphery of disc 22.

Fine tuning is accomplished by means of rotating knob 46 and thus shaft 44. The rotation of shaft 44 rotates gear 48 which in turn rotates gears 38, 58 and 36 mounted on shaft 34. The rotation of gear 36 rotates gears 14, 12 and 10 to drive input member B. The rotation of shaft 44 causes shaft 58 to drive flywheel 56 in a direction opposite to the rotation of shaft 44. Since the moment of inertia of inertia means F is equal to but opposite from the moment of inertia of fine tuning means E, the moment of inertia of inertia means F cancels the moment of inertia of fine tuning means E. However, this has no effect on the mechanism during fine tuning. Inertia means F affects the mechanism only during channel selection.

During channel selection, the rotation of selector shaft 18 causes the rotation of fine tuning means E. If inertia means F were not present in the mechanism, the intermittent motion of shaft 18 and the relatively rapid termination of the movement thereof caused by the detent mechanism would cause knob 46 and fine tuning shaft 44 to continue to rotate after the termination of the movement of shaft 18 and thus to rotate through an angle greater than the angle through which shaft 18 was rotated. However, this effect is counterbalanced by the mass of inertia means F which is rotated simultaneously with shaft 44 but in an opposite direction. The movement of inertia of inertia means F (for any given design) may be made exactly equal to the moment of inertia of knob 46 together with the associated components such as shaft 44 and gear 48. When this is done, no additional rotation of shaft 44 caused by the moment of inertia thereof can occur, no matter how fast or how slowly the detented shaft 18 is turned, or how stiff and positive the detenting action may be. The force causing this additional motion of the fine tuning shaft is completely cancelled by inertia means F. With this improvement, while some friction loading of the fine tuning system is necessary and desirable, the amount of frictional loading necessary is drastically reduced. Only a nominal amount of friction loading suffices to control fine tuning integrity under the most rugged conditions of operation.

In practice, production devices using this invention may be designed to match exactly the moment of inertia of the fine tuning shafts and particular control knobs which are to be used therewith. However, since many different types of control knobs are utilized, it may be more practical to design the system such that the inertia means F has a value of mass which approximates the average inertia of the various selector knobs available and rely upon friction to damp out motion resulting from limited mismatch.

The basic invention provided herein is that of having a reactive mass rotate with the detented selector shaft and have approximately the same inertial effect on the drive means as the fine tuning means. The inertial mass is caused to rotate in an opposite direction from the fine tuning means in order to neutralize the moment of inertia thereof. While this disclosure has been based, for simplicity, on the use of a ratio of one (equality) between the angular velocity of fine tuning means E and flywheel 56 relative to shaft 34, this need not be the case, so long as the condition of the inertial effect on shaft 34 caused by the flywheel 56 is equal to but in an opposite sense from the inertial effect of fine tuning means E. For instance, flywheel 56 might be designed to have a low mass, but through the use of a larger gear 58, be caused to have the same inertial effect upon shaft 34 as the example shown in this disclosure.

A single preferred embodiment of the present invention has been specifically disclosed herein for purposes of illustration. It is apparent that many variations and modifications may be made upon the specific structure disclosed herein. Differences may exist, for example, such as using a cam and lever fine tune drive reduction place of gears 14 and 36. Also, a means for obtaining the moderate amount of friction loading required may be other than shown without departing from the scope of the invention. Thus, it is intended to cover all of these variations and modifications which fall within the scope of this invention as defined by the appended claims.

I claim:

1. A tuner drive assembly for use with a tuning element conditionable to select a particular frequency by the movement of an input member comprising movable coarse tuning means, movable fine tuning means adapted to move when said coarse tuning means is moved, drive means operably connected to said coarse tuning means, said fine tuning means and said input member and adapted to drive said input member in accordance with the movements of said coarse tuning means and said fine tuning means respectively, said fine tuning means having a given inertial effect on said drive means during the movement of said coarse tuning means, and inertia means operably connected to said drive means and said fine tuning means and movable relative to the latter during movement thereof, said inertia means having an inertial effect on said drive means during meovement of said coarse tuning means substantially equal to but in an opposite sense from said given inertial effect.

2. The assembly of claim 1 wherein said inertia means comprises movable mass means and motion transferral means, said motion transferral means operably connected to said fine tuning means and to said mass means and effective to move said mass means in a sense opposite to the movement of said fine tuning means.

3. The assembly of claim 2 wherein said mass means comprises a rotatable flywheel.

4. The assembly of claim 3 wherein said flywheel has a gear surface and wherein said motion transferral means comprises a rotatable gear adapted to mesh with said surface.

5. The assembly of claim 1 wherein said coarse tuning means comprises a rotatable coarse tuning shaft, said fine tuning means comprises a rotatable fine tuning shaft, said drive means comprises a drive shaft mounted on said coarse tuning shaft but radially offset from the axis of rotation thereof and first and second gears fixedly mounted on said drive shaft, said first gear operably connected to said fine tuning shaft to be driven thereby and said second gear drivingly connected to said input member.

6. The assembly of claim 5 wherein said inertia means comprises a third gear fixedly mounted to said drive shaft and a rotatable flywheel threaded to mesh with said third gear.

7. The assembly of claim 6 wherein said flywheel rotates about the same axis as said coarse tuning shaft.

8. The assembly of claim 6 wherein the combined inertial effect of said flywheel and said third gear on said drive shaft during rotation of said fine tuning shaft is substantially equal to but in an opposite sense from the inertial effect on said drive shaft of said fine tuning means during rotation of said coarse tuning shaft.

* * * * *